United States Patent [19]

Andrews

[11] 4,066,804

[45] Jan. 3, 1978

[54] METAL DEPOSITION PROCESS

[75] Inventor: Timothy Douglas Andrews, Manningtree, England

[73] Assignee: Imperial Chemical Industries Limited, London, England

[21] Appl. No.: 510,994

[22] Filed: Oct. 1, 1974

Related U.S. Application Data

[60] Division of Ser. No. 222,991, Feb. 2, 1972, Pat. No. 3,853,589, which is a continuation-in-part of Ser. No. 88,173, Nov. 9, 1970, abandoned.

[30] Foreign Application Priority Data

| Nov. 26, 1969 | United Kingdom | 57862/69 |
| May 26, 1970 | United Kingdom | 25203/70 |
| May 20, 1971 | United Kingdom | 16006/71 |

[51] Int. Cl.$^2$ .............................................. B05D 5/12
[52] U.S. Cl. ........................................ 427/98; 427/129; 427/304; 427/305; 427/306; 204/30
[58] Field of Search .......... 117/47 A, 47 R, 138.8 E, 117/138.8 R, 148, 130 E, 160 R, 213, 118; 204/30; 427/306, 304, 305, 98, 129

[56] References Cited

U.S. PATENT DOCUMENTS

| 2,979,422 | 4/1961 | Bersin | 427/306 |
| 3,033,703 | 5/1962 | Schneble et al. | 427/306 |
| 3,035,944 | 5/1962 | Sher et al. | 427/306 |
| 3,083,118 | 3/1963 | Bridgeford | 427/306 |
| 3,111,424 | 11/1963 | LeClair | 427/306 |
| 3,222,210 | 12/1965 | Hammond | 427/400 |
| 3,222,218 | 12/1965 | Beltzer et al. | 427/306 |
| 3,326,719 | 6/1967 | Beltzer et al. | 427/306 |
| 3,429,706 | 2/1969 | Shepard et al. | 427/306 |
| 3,436,468 | 4/1969 | Haberecht | 427/306 |
| 3,579,428 | 5/1971 | Kuroda et al. | 204/30 |

*Primary Examiner*—Harry J. Gwinnell
*Assistant Examiner*—Janyce A. Bell
*Attorney, Agent, or Firm*—Cushman, Darby & Cushman

[57] ABSTRACT

Metal is deposited on a substrate containing neutral radicals, radical cations or neutral molecules (the latter being derived from a dication normally stable in aqueous media), by contacting the substrate with an electroless plating solution, optionally after sensitization with a salt of a platinum group metal silver or gold. The use of the process for data recording, particularly for the production of magnetic information carriers e.g. tapes or discs, metallizing plastic foam and for producing printed circuits is described.

19 Claims, No Drawings

METAL DEPOSITION PROCESS

This application is a division of application Ser. No. 222,991 filed Feb. 2, 1972, now U.S. Pat. No. 3,853,589, which was a continuation-in-part of application Ser. No. 88173 filed Nov. 9, 1970.

GENERAL PRINCIPLES OF THE INVENTION

This invention relates to a metal deposition process, and in particular to a process for the deposition of metals onto organic materials.

According to the invention metal is deposited in or on a substrate containing or consisting of, as active component, an organic compound selected from
1. neutral free radicals,
2. radical cations, and
3. neutral molecules, Z, derived from compounds containing dicationic units by two electron reduction, said dicationic compound being $Z^{++}$ in the equation

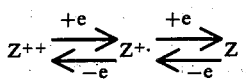

and in which $Z^{++}$ is the normally stable oxidation state of the molecule in aqueous media;
preferably, by contacting the substrate with a electroless plating solution, said dicationic compound is a salt containing in the molecule nitrogen atoms, at least two of which are quaternised and are also contained in linked at least partially aromatic rings, the link providing a chain of conjugated unsaturation between the nitrogen atoms.

The term "electroless plating solution" is used in its normal meaning in electro-plating technology, that is, a solution containing a metal salt and a reducing agent capable of depositing metal without the external application of an electrical potential. This deposition occurs in a way which has not yet been satisfactorily explained, merely requiring some form of activation of the receiving surface, e.g. by abrasion or by an initial deposit of a trace of metal. The present invention resides in the discovery that the above defined organic compounds are capable of causing metal to be deposited from the electroless plating solution. Once a trace of metal has been deposited on the organic material, the metal so deposited is capable of catalysing further deposition of the same or a different metal from the appropriate solution, and a layer of metal can be built up.

In a modification of the invention, the substrate containing or consisting of organic compounds selected from neutral free radicals, radical cations or a defined neutral compound is contacted first with sensitiser comprising a solution of a compound of a metal of the platinum group (Ru, Rh, Pd, Os, Ir, Pt) silver or gold and subsequently with the electroless plating solution. This technique is preferred in some cases where the straight forward electroless plating without the sensitiser requires too long a processing time or too high a temperature for convenience.

THE SUBSTRATE

The active component of the substrate is the neutral radical, radical cation or defined neutral compound. The active component may itself form the substrate or a support may be used to carry the active component in or on it. The support may be inert towards the active component, or may have a stabilising influence on it. In this way some normally highly active radicals may be stabilised to allow treatment with the electroless plating solution even though there is a delay between their formation and reaction with the plating solution.

Free radicals which may be used include those generated by decomposition or peroxides or organometallic compounds. Free radicals may be obtained by the thermal decomposition of many compounds, including the bipyridyl and related compounds mentioned below. Stable free radicals may also be used, e.g. diphenyl picryl hydrazyl.

Preferred radical cations which may be used are those which contain two unsaturated heterocyclic or azulene ring systems (both of which may be substituted) linked directly or by a chain of conjugated unsaturation. Examples of such radical cations are tetrathiotetracene, tetraselenotetracene, bis(indolizinum)ethylene, bis(-benzthiazolinylidene)azine, bis(quinolyl)azine, and bis-(azulenyl)-ethylene and substituted derivatives thereof, especially with lower alkyl (1-10 carbon atom) and aryl, e.g. phenyl substituents. These radical cations are used in the form of salts of anions such as halide, perchlorate, tetrafluoroborate, methyl sulphate, bisulphate, acetate and polymeric anions such as poly(p-vinylbenzene sulphonate), poly(acrylate) and poly(styrylphosphonate).

Another group of radical cations is that derived by reduction from the group of dications on which the above definition of active neutral componds is based. This relationship will be made clearer by the following equation. Compounds such as bipyridyls can be oxidised/reduced according to the scheme:

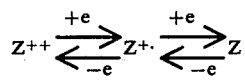

Thus a dication (the normally stable oxidation state in aqueous media) supplied with a single electron forms a radical cation, which with a further electron is converted to the neutral compound. Both $Z^{z+}$ and Z are active in the required manner according to our invention, with electroless plating solutions, where $Z^{++}$ is the stable form in aqueous media.

Especially preferred active compounds for use in our invention are neutral compounds and radical cations derived from dications of the general formula (1).

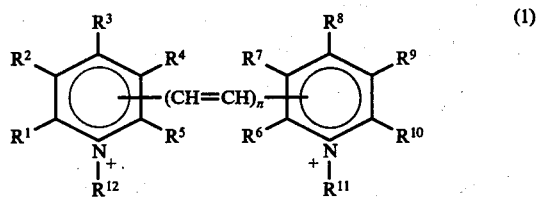

where $R^{1-12}$ are hydrogen, halogen or organic substituents (including groups between units having the structure 1, which form polymeric salts), $n = 0$ or an integer.

Usually the link joins the two aromatic rings in the 4,4'- or 2,2'-positions, when it replaces $R^{3,8}$ or $R^{5,b}$, e.g. 2,2'-bipyridyls and 4,4'-bipyridyls.

Pairs of substituents on the same or adjacent rings may be links to form cyclic structures. For example, in compounds containing a 4,4'-bipyridyl structure (2)

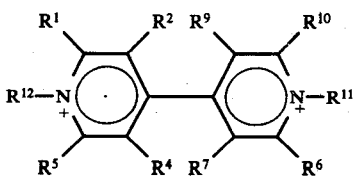

(2)

pairs of groups R may be linked to form a single divalent unsaturated organic group, particularly the pairs $R^{1,2}$, $R^{4,5}$, $R^{9,10}$, $R^{6,7}$, $R^{2,9}$ and $R^{4,7}$. In the first four of these cases, the divalent organic group may form a fused aromatic ring as in biquinolyl compounds. When $R^{2,9}$ and $R^{4,7}$ are both joined by ethylenic groupings, a diazapyrene nucleus is formed.

The active compound may be a simple compound or radical cation, or it may be part of a more complex molecule, as in dimers. It may also be polymeric, in which case the active unit may be contained in the polymer backbone, in end groups or in side chains or in combinations of such positions.

The defined neutral compounds and radical cations which are described generally above and which will be described in greater detail with the examples later, have the common feature of being formable from a cationic compound on exposure to heat or radiation. Salts containing mono cations are reduced to neutral radicals.

Examples of monomeric cations with the above properties are (3) and (8).

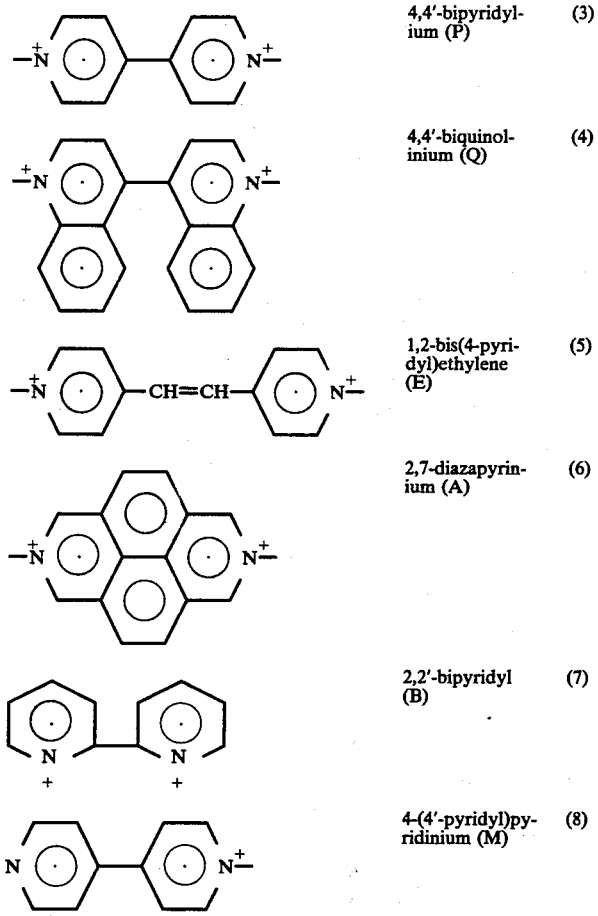

The reference letter following each name will be used in the following description to indicate the appropriate cationic unit to avoid repeating the whole structural formula. Thus $CH_3 — P — CH_3$. $2Cl^-$ represents N,N'-dimethyl-4,4'-bipyridylium chloride. It is implicit in this nomenclature that the $CH_3$ groups are linked to the nitrogen. It is to be understood however that substitution on the carbon atoms of the nuclear unit is possible. Such substituents include alkyl, aryl, aralky, alkaryl and oxyhydrocarbyl groups. Of the halogens, chlorine and fluorine are preferred. It is desirable that readily reducible groups are absent, e.g. $NO_2$. Therefore when using the symbol P, D, Q etc., it will be clear that as well as the parent compound, suitably substituted derivatives may also be used, e.g. 2,2'-dimethyl-4,4'-bipyridilium compounds.

The active component may be formed into or incorporated in the substrate in a variety of ways. A solution of the active component may be used to impregnate a porous support such as paper, cloth, wood or plastics foam. A solvent appropriate to the active component is used, e.g. organic solvents for neutral radicals and neutral compounds, aqueous or organic solvents for cationic compounds. In many applications it is desirable to produce the substrate in the form of a film. This may be readily achieved by solvent casting, preferably in the presence of a polymeric support. In the case of the radical cations and neutral compounds prepared from the defined dications, the preferred procedure is to support the dicationic compound in a water soluble or swellable film forming polymer matrix and to convert the dicationic unit to radical cation or neutral compound in situ by means of radiation or heat. The procedure for forming such films is described in detail for bipyridyl and related compounds in our copending application Ser. No. 50910 now U.S. Pat. No. 3,671,250. For the monomeric cations referred to earlier as P, Q, E, A, B, M ultraviolet radiation and electron beams are the preferred forms of radiation for conversion to the radical cation and on longer exposure, to the neutral compound.

Water soluble or a swellable polymer suitable for as the matrix material include poly(vinyl alcohol), poly-(ammonium methacrylate), gelatin, alginates, and maleic anhydride copolymers e.g. with styrene methyl vinyl ether, or ethylene.

Soluble polysaccharies such as polysucrose may also be used. Polyvinylpyrrolidone is also useful, and good results have been obtained with mixtures of film forming polymers, especially with mixtures of poly(vinyl alcohol) with poly(vinylpyrrolidone), using 40–80% of the latter.

The proportions of salt and film-forming polymer used are not particularly critical, being dictated mainly by practical considerations and sensitivity required. Typically a solution for film casting consists of water soluble polymer 5–20 parts, salt conferring radiation sensitivity whether it is simple or polymeric, 0.1 to 10 parts, and water to 100 parts. All parts herein are by weight. Storage and handling must obviously be in the absence of radiation to which the materials are sensitive.

While water soluble polymers are preferred, certain water insoluble polymers may be used if dissolved in a suitable solvent. An example is a copolymer of 1,6-diaminotrimethyl hexanes and terephthalic acid which may be cast into films using a polar solvent such as dimethyl formamide and the appropriate salt.

Examples of compounds containing dications which may be converted at least into radical cations by heat or radiation in the presence of a water soluble or swellable polymer are: R — P — R 2X⁻ where R is:

(9) —CH₃, X=Cl, Br, SiF₆, HSO₄—, CH₃SO₄—

(10) —CH₂—CH₂— 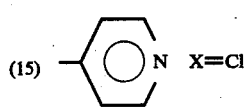

(11) —CH₂CH₂— 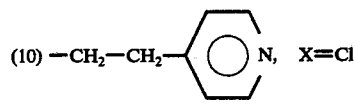 X=Cl

(12) 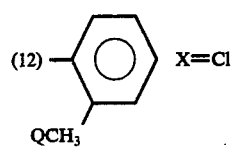 X=Cl
OCH₃

(13) —CH₂CO— 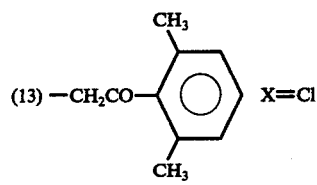 X=Cl

(14) —CH₂— 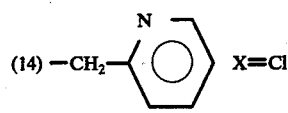 X=Cl

(15) 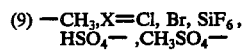 X=Cl

(16) —CH₂CO N(C₂H₅)₂   X=Cl

(17) —CH₂— 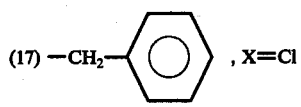, X=Cl

(18) —CH₂CO NH— 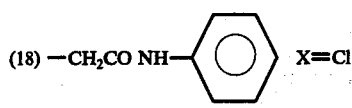 X=Cl

(19) —CH₂CO NH—t-but.   X=Cl

(20) —(CH₂)CO CH₃   X=Br

(21) —CH₂CH₂OH   X=Cl

(22) —(CH₂)ₙCON⟨i-prop / i-prop⟩   X=Cl

(23) —CH₂CO NH— 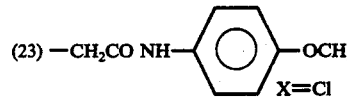 —OCH₃
X=Cl

(24) —CH₃COOC₂H₅   X=Br

(29) , X=Cl t-but = tertiary butyl
i-prop = isopropyl

The groups R may be different as in

(30) CH₃—P— 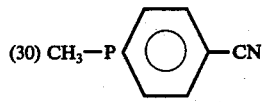 —CN

M—R′ X⁻

(25) 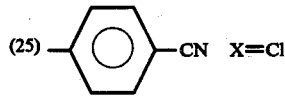 —CN   X=Cl

(26) 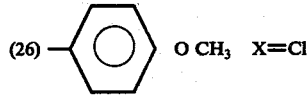 —OCH₃   X=Cl

(27) 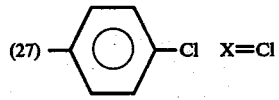 —Cl   X=Cl

(28) 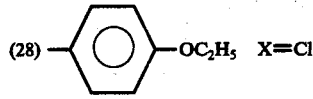 —OC₂H₅   X=Cl where R′ is

(31) 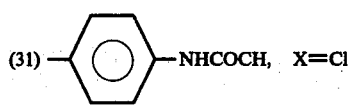 —NHCOCH,   X=Cl

-continued

(32) 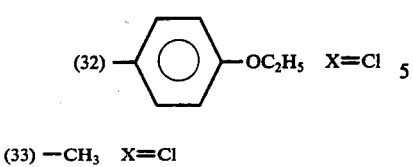 X=Cl

(33) —CH₃  X=Cl

Other compounds which have been tested are

(34) CH₃—Q—CH₃ (CH₃SO₄⁻)₂   (36) CH₃—E—CH₃ (CH₃SO₄⁻)₂

(35) 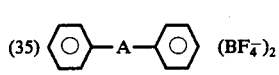 (BF₄⁻)₂   (37) 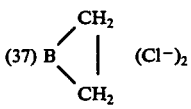 (Cl⁻)₂

The colours of the radical cations are mainly green or blue or purple, but other colours may be obtained, e.g. compound (34) gives a pink colouration.

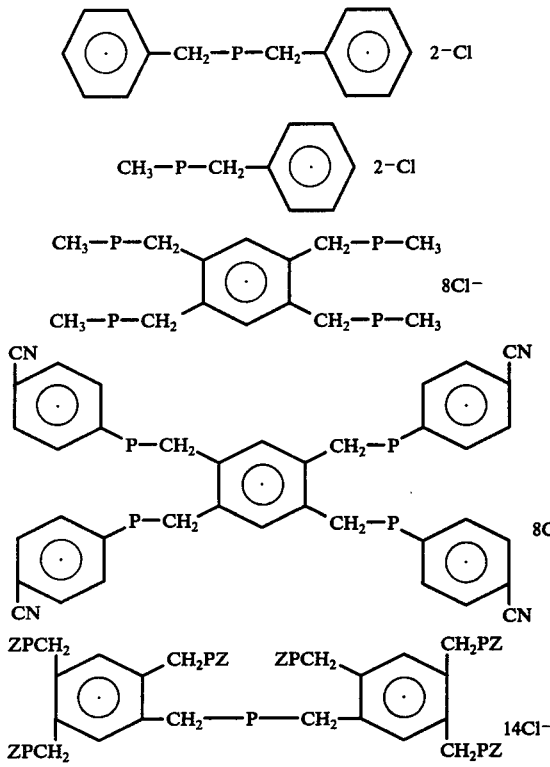

(38)

(39)

(40)

(41)

(42)

where Z is —⌬—CN  or  —CH₃

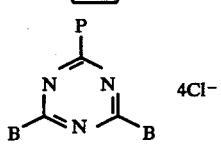

(43)

where B = base, such as pyridine, quinoline, or a mono-quaternised bipyridyl (M).

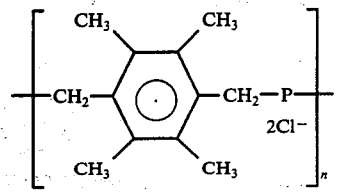

(44)

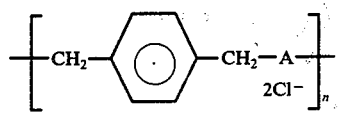

(45)

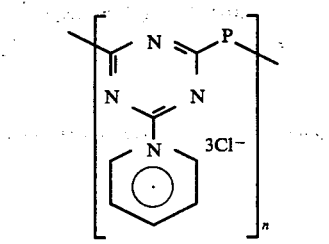

(46)

polymeric anions may be also used. Zwitterionic compounds are also effective; for example

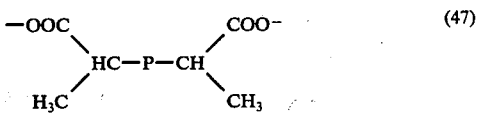

(47)

THE ELECTROLESS PLATING SOLUTION AND PROCESS

Electroless plating solutions are well described in the literature, especially the plating solutions for the deposition of silver, copper and nickel. A general reference which contains useful formulae is W. Goldie - "Metal Coating of Plastics", Vol. 1 (1968). Other useful formulae are contained in Dutch Patent Application 6901919 and German Patent Application 1900983. Commercially available solutions such as the "Enplate" series of Enthone Inc., New Haven, Connecticut are suitable.

The most readily available solutions for use in our invention are those containing metals of Group VIII and IB together with mercury, lead, tin, antimony and bismuth.

Silver and copper containing solutions in which the reducing agent is an aldehyde such as formaldehyde may be used. silver-containing solutions in which the reducing agent is an aminophenol or one or more of the other common organic reducing agents used in photographic developers are also of general application. A suitable iron, cobalt or nickel depositing system comprises a hypophosphite solution. The preparation of specific solutions will be described in the Examples.

It is known that palladium and to a lesser extent other metals such as platinum metals, silver and gold catalyse the decomposition of electroless plating solutions. This phenomenon may be utilised in the present invention by sensitising the active substrate by contacting it with a compound of the metal required conveniently in solution, and subsequently contacting this sensitised substrate with the electroless plating solution thereby enabling the processing time and/or temperature to be reduced. A simple palladium salt may be used: palladium chloride is quite suitable, at a concentration in the range of 0.001 to 10 parts per 1000 in water. Platinum, osmium, irridium, ruthenium, rhodium, silver or gold salts may be used similarly. Th preferred concentration of the platinum or palladium solution is about 0.1 parts per 1000 parts of water, based on the weight of halide. A useful palladium chloride activator solution may be made by diluting the preparation, available commercially as "Enplate" Activator No. 440, 1:15 with water. Typically the active substrate is immersed in the sensitiser solution for 0.5 to 5 minutes at 15°–30° C, washed and then transferred to the electroless plating solution proper.

The active, optionally, sensitised, substrate is contacted with the electroless plating solution until the required amount of metal has been deposited. This can usually be gauged visually: the colour of the organic compound is discharged and is replaced by finely divided metal to give a darker image. The metallised image darkens as the metal first formed catalyses the reduction of the solution. In this way the optical density of the image may be intensified.

Where the active components are contained in a supporting film based on a water soluble or swellable polymer such as polyvinyl alcohol, some precautions may be needed to prevent damage to or loss of the substrate during processing. If the process of contacting the substrate with the plating solution is carried out in cold (e.g. room temperature) solutions then the water soluble polymer should be selected such that its solubility in cold aqueous media is much less than a hot aqueous media. Suitable grade of polyvinyl alcohol is a medium to high molecular weight 99–100% hydrolysed polyvinyl alcohol e.g. Du Pont "Elvanol" grades 7130, 72-60 or 73-125, or Nippon Gohsei "Gohsenol" all "N" grades. As an alternative, or an additional precaution, the metal image forming process can be carried out in the presence of a high concentration of ions, by addition of inactive salts. 1 to 30% by weight of alkali metal or ammonium salt may be used: ammonium, sodium or potassium sulphates are preferred in concentrations from 1 to 5% by weight of the plating solutions.

A further alternative or additional precaution is to pretreat a polyvinyl alcohol film with an aqueous borax solution or glyoxal solution to introduce cross-linking between polymer chains; a source of borate ions e.g. borax may be included in the plating solution where, in some cases, it increases the plating rate so that lower plating temperatures can be used.

It is also advantageous to include in the plating solution a surface active agent. This reduces the tendency to deposit metal prematurely. Long chain amines may be used. For the same purpose up to 5%, preferably about 2% by weight polyvinyl pyrrolidone may be used.

When a silver based plating solution is used, some precautions are required to prevent precipitation of silver halides. Either a halide free substrate is used or a suitable complexing agent is used, and the use of polyvinyl pyrrolidone in the above mentioned concentration gives this additional advantage.

If electroless plating is continued for a sufficient period, sufficient metal is deposited to render the substrate conducting. The conducting metal deposit may then be further metallised by conventional electroplating with the same or different metal. Plastics foams may also be made conducting by a similar technique.

DATA RECORDING APPLICATIONS

An important application of the present invention is in rendering permanent or intensifying images (latent or visible) in those silver-free photographic systems where the image is in the form of organic neutral free radicals, radical cations or defined neutral compounds. An example of such a system is described in our copending patent application being based on nitrogenous salts which on exposure to radiation form radical cations. Preferred salts are those based on compounds containing two quaternised nitrogen atoms with a chain of conjugated sites of unsaturation between the nitrogen atoms. All of the photosensitive compounds described earlier are capable of application in this aspect of the invention. The photosensitive compound in a water soluble or swellable film forming polymer matrix, on exposure to radiation, especially ultraviolet or short wavelengths visible radiation, is converted into mainly radical cations. The polymeric matrix is capable of stabilising the radical cations formed, but eventually the combined effect of oxygen and moisture bleaches the image unless this is kept under dessication. If the radical cation image is treated according to our process, it is rendered as permanent as in conventional photographic systems, while retaining most of the advantages of high resolution possessed by the light sensitive material we have already described. 1500 line pairs $mm^{-1}$ can be resolved. Care must be taken however not to proceed with the metallising process too far if the sole aim is high resolution as the growing area of metal deposit will reduce resolution. Thus in some cases it may be necessary to balance resolution with optical density.

The film forming polymer may include in addition to the active component, the additives described in our copending application for (1) speed improvement (i.e. compounds containing active hydrogen as in alcohols and amines, including alcohols, phenols, carboxylic acids, and sugars, e.g. glucose, oxlic cid, p-chlorobenzoic acids, glycerol, phenol, ethylene diaminetetracetic acid (disodium salt), picric acid, glycine, $\beta$-alarine, mellitic acid, triethanolamine, thiazine, and nictoinamide adenosine dinucleotide phosphate), (2) sensitisers (i.e. compounds which extend the response well into the visible region of the spectrum. Riboflavin, as free base, Acronol yellow (a dyestuff comprising 3,6-dimethyl-2-(4-dimethyl-aminophenyl)-benzthiazolium chloride) and alkaline solutions of the wood resin derivative known as collophony, which are capable of extending the sensitivity up to or beyond 500 nm and other sensitisers which include 3,3'-diethylthiacyanide iodide, proflavin, acridine orange, acriflavin, N-methylphenazinium methyl sulphate, 4-cyanoquinolinium methiodide and erythrosin, (3) desensitising (i.e. compounds which may be added to reduce the spectral response, so that the film may be handled in daylight, include p-aminobenzoic acid, 6-amino-3,4-phthaloylacridone and urazole, (4) miscellaneous additives (i.e. compounds which may be incorporated in the film to modify the radiation sensitivity or physical properties of the finished material. For example, ammonium chloride improves the sensitivity to light and also film pliability and other water soluble plasticisers, such as urea, glycerol and other polyols, may also be used to improve this property. Sensitivity to X-rays may be increased by the introduction of a compound of metal of high atomic weight such as barium chloride).

Self supporting films may be prepared from water soluble polymers, conveniently about 0.2 to 2 mm thick. Preferably however, the film is prepared as a coating on a flexible base, such as polyethylene terephthalate film, when the coating thickness can be reduced to 0.001 to 0.1 mm.

Data may be recorded on the film by means of ultra-violet or visible radiation of the appropriate wavelength, by electron beam or by infra-red radiation which causes the film to heat locally to a temperature at which the radical cation is formed. The exposed film should then be processed according to our invention as soon as possible. If it is proposed to store the exposed film for a long time before processing it is desirable to do so under dry and/or oxygen free conditions.

One particularly suitable application is the production of magnetic information carriers by using the process of the present invention to deposit a magnetic coating on a support to which the active component has been applied.

The support may be a non-magnetic metal, for example an aluminium disc (to make magnetic discs for computer data processing) or may be non-metallic, for example for the production of audio, video, instrumentation and computer recording tapes, preferably incorporating a polyethylene terephthalate film support.

The non-metallic support may be made of a material chosen from paper; cellulose acetate; cellulose nitrate; ethyl cellulose; regenerated cellulose; methyl cellulose; polyamide; polymethyl methacrylate; polytrifluorochloroethylene; polytetrafluoroethylene; polymers or copolymers of α-olefines, such as ethylene, propylene and 4-methyl pentene-1; polymers and copolymers of vinyl chloride; polyvinylidene chloride; polycarbonates; polyimides; polysulphones; and linear polyesters such as polyethylene terephthalate and polyethylene-1:2-diphenoxyethane-4:4'-dicarboxylate.

The present invention is particularly useful in the production of magnetic recording tapes. For such tapes the non-metallic support should normally exhibit a high longitudinal tensile strength consistent with a satisfactory transverse strength and resistance to fibrillation. The support should also be dimensionally stable. Such properties are provided by biaxially oriented and heat set polyethylene terephthalate film. The so-called "tensilised" grades of polyethylene terephthalate film which have generally higher longitudinal tensile strengths than normal grades are particularly useful.

When the support consists of a polymeric film it is generally biaxially oriented to provide the desired properties. Methods of production of such films are well known in the art.

Many of the supports, e.g. polyethylene terephthalate, suitable for the production of the information carriers according to this invention are hydrophobic. Accordingly it is generally desirable to pretreat the surface of the support so as to improve its adhesion to the active component or the composition containing the active compoment which is applied over it. Thus the surface of the support can be subjected to a physical or chemical treatment or an anchor coat may be applied to it. Alternatively, a physical or chemical treatment may be used in conjunction with the application of an anchor coat. Convenient physical or chemical treatments include treating the surface with etching or solvent agents such as chromic acid in sulphuric acid, hot nitric acid, potassium permanganate and o-chlorophenol; exposing the surface to ozone; exposing the surface to flame treatment; and exposing the surface to ionising radiation such as that commonly known as corona discharge treatment.

Useful anchor coats include those suitable for improving the bonding properties to photographic emulsions, for example copolymers of conjugated diolefines, particularly butadiene, with one or more comonomers selected from acrylonitrile, styrene, methyl methacrylate, methacrylic acid and itaconic acid, such as a butadiene/styrene/itaconic acid terpolymer, preferably in the proportion 25 to 40/53 to 74.5/0.5 to 7 mole % respectively.

Other anchor coat formulations include copolymers or terpolymers of vinylidene chloride containing at least 35 mole % of vinylidene chloride. Suitable comonomers are vinyl acetate, vinyl propionate; vinyl chloroacetate; vinyl chloride; vinyl bromide, methyl, isobutyl or chloroethyl methacrylate; methyl chloroacrylate; itaconic acid and the methyl, ethyl and butyl esters of itaconic acid; acrylonitrile; methacrylonitrile; styrene; and acrylic esters such as methyl methacrylate, ethyl methacrylate, butyl methacrylate, methyl acrylate, ethyl acrylate, propyl acrylate and butyl acrylate, and acrylic and methacrylic acids. Terpolymers of vinylidene chloride comprising 75 to 95 mole % of vinylidene chloride, 4 to 20 mole % of an acrylic ester as methyl acrylate and 0.5 to 5 mole % of itaconic acid are useful.

Polymers, copolymers and terpolymers of a vinyl halogenoester or a vinyl cyanoester may alternatively be used as the anchor coat. Suitable formulations are disclosed in British Specifications Nos. 1 208 821 and 1 208 822.

Polyvinyl alcohol is another suitable anchor coat.

A layer of gelatin may also be used in conjunction with or instead of layers of the above anchor coating materials.

The anchor coat may be applied to the surface of the completed base, that is for example in the case of polyethylene terephthalate film after it has been biaxially oriented and heat set. When the support is biaxially oriented by a sequential stretching process the anchor coat may be applied between the stretching operations; such a technique is useful in the production of a polyethylene terephthalate film base.

The overall thickness of the anchor coat layer or combination of layers is preferably in the region of one micron.

Preferred magnetic coatings are nickel/phosphorus or nickel/cobalt/phosphorus.

A plating solution which deposits a nickel-cobalt-phosphorus layer is useful according to this invention. Depositions from such solutions may be effected by the autocatayltic reduction of nickel and cobalt source ions, with hypophosphite ions serving both as a reducing agent and a source of phosphorus for the deposited ferromagnetic alloy. A suitable solution has the following composition (measured in parts by weight)

60 parts Cobalt chloride ($6H_2O$)
2 parts Nickel chloride ($6H_2O$)
200 parts Sodium potassium tartrate ($4H_2O$)
50 parts Ammonium chloride
17 parts Sodium hypophosphite
40 parts Anhydrous sodium sulphate
4 parts Borax
   Ammonia to pH9
   Water to 1000 parts.

Such an electroless plating solution may be employed within a temperature range of 20° to 95° C, preferably 25° to 50° C. Using such a bath at 30° C a plating of about one micron in thickness can be deposited in 60 minutes.

Other useful electroless plating solutions include that available commercially as "Enplate" Ni-410 (Enthone Inc.) and that having the following composition by weight:

25 parts Nickel dichloride (6H$_2$O)
65 parts Malic acid (monosodium salt)
55 parts Gluconic acid (sodium salt)
35 parts Sodium hypophosphite
Ammonia solution; S.G. 0.880 to pH9.

A solution capable of depositing cobalt and phosphorus may include cobalt sulphate, sodium hypophosphite, ammonium sulphate and sodium citrate.

Providing the deposition of ferromagnetic material is not too excessive the high resolution is reproducible in the magnetic information carriers. Accordingly it is possible to increase the storage capabilities of a carrier produced according to the invention by disposing the recording tracks closer together than is possible with carriers produced by conventional photographic techniques. This is of particular advantage in high density recording, for instance in computer input or output recording tape.

By virtue of the high resolution achieved by the present invention it is possible to deposit the ferromagnetic material in sharply defined and closely packed discrete patterns over the surface of the support. Accordingly discrete ferromagnetic recording filaments or tracks may be deposited parallel to the read/write axis of a recording tape along which the reading or recording transducers traverse. It is also possible to arrange the recording filaments or tracks transversely across the recording tape and to traverse the recording or reading transducers appropriately across the tapes. Other forms of recording zones include ferromagnetic spots conveniently in the shape of ellipses, deposited on the surface of the support. Alternatively information may be recorded in one or more variable area or variable density tracks. It will be understood that whereas the invention is described mainly with reference to recording tapes which are our preferred form of information carrier, other forms such as recording discs and cards also fall within the ambit of this specification.

Recording filaments or tracks on magnetic recording tapes produced according to this invention have higher information storage capabilities when used in saturation digital recording than tapes produced by conventional processes. It has been found that adjacent tracks of conventional magnetic tapes tend to degrade each other. This effect arises through the magnetic fields of one track interfering with and demagnetising part of the bit-domain of an adjacent track, thereby reducing its sharpness and the strength of its read-out signal. This interference can be reduced by making the track as narrow as possible, that is filamentary, so as to approach the width of a single unidirectional domain as long as the readout voltage is not reduced to an unacceptable level. This reduction in width is made possible by the high resolution obtainable with this invention.

It is also possible to make the inter-track or filament zones very narrow without impairing the efficient performance of the tape through inter-track or filament interference.

In some circumstances where only a very small amount of adjacent track interference can be tolerated, e.g. in high density digital storage, and the very narrow width of a single filamentary track which would be necessary to reduce the interference to an acceptable level leads to inadequate read-out voltages, it is possible to use a multifilamentary track. In such a system the filaments act in combination to produce the desired level of read-out voltage. Accordingly read-out voltage can be maintained at a desirable level and track interference is minimised.

Prior art magnetic recording tapes are often made by applying ferric oxide particles in a resinous binder to the surface of a support. The particles are aligned by subjecting them to the influence of a magnetic field while the binder cures or the solvent used to apply it evaporates off. These measures are complex and inconvenient for certain types of tape having a complex arrangement of recording track and are to a large extent or even completely eliminated by the present invention by virtue of the fact that narrow filamentary tracks can be deposited on the support which do not require magnetic domain orientation.

The production of tapes or other forms of information carrier according to this invention is effected by exposing the coated support with suitable sensitizing radiation. When a discrete pattern of ferromagnetic material, e.g. in the form of filaments or tracks, is to be applied to the tape or other carrier the coating is exposed by directing the sensitizing radiation through a negative image of the desired pattern. The exposed areas of the coating become sensitized and susceptible to electroless plating by the techniques hereinbefore described thereby depositing the desired ferromagnetic material pattern.

In the past magnetic information carriers, particularly magnetic recording tapes, have carried magnetic coatings such as those based on ferric oxide having a thickness up to about 10 microns, generally greater than 4 microns but thicknesses as low as 3 microns have been employed for less critical audio uses. The ferromagnetic layers applied according to this invention can be applied in smaller thicknesses of 0.1 micron with satisfactory read/write performance. Generally a plating thickness of the order of 2 microns is adequate, a thickness of about 1 micron being useful for most applications although a thickness in the region of 0.1 micron is useful for certain applications. Hence with a reduced coating thickness it is possible to store more information on a given size of spool or cassette.

For magnetic tapes, generally the support may have a thickness up to about 50 microns. The thickness chosen in practice will generally be the thinnest possible consistent with the desired strength for the particular application. Tensilised film is particularly useful as a compact tape having the requisite longitudinal strength can be made from thin film.

Polyethylene terephthalate film is preferred for the production of such tapes. Where compactness is desirable it is advantageous to use tensilised film. If this is not so important balanced film, that is film which is oriented by stretching to substantially the same extent in the longitudinal and transverse directions, may be used.

Audio recording tape produced according to this invention may use balanced polyethylene terephthalate film having a thickness in the range 25 to 40 microns, conveniently around 36 microns for standard tapes. Audio tapes having a higher recording capacity may be produced from tensilised polyethylene terephthalate film having a thickness from 4 to 20 microns, preferably between 6 and 15 microns. Such tape is suitable for storage in cassettes.

Video tapes, in which the picture image is recorded magnetically and audio and control tracks are also incorporated on the same tape, generally require high storage capabilities and may be made on a tensilised polyethylene terephthalate film support of the same charcter specified for audio tapes.

Computer and instrumentation tapes may be made on balanced film but they too can be made on a tensilised polyethylene terephthalate film support as specified for audio tapes when high storage capabilities are required. They may also be stored on cassettes.

Instrumentation tapes are particularly useful for monitoring the operation of an industrial plant by recording the variations of controls and/or process conditions.

Information may be recorded upon and read-out from the magnetic information carriers according to this invention by any of the known systems, e.g. by inductive recording. A magneto-optic recording system may be employed if desired. In such a system information may be written into a carrier in which the magnetic coating is initially uniformly saturated in one direction by illuminating the recording location briefly with a light beam so as to raise the local surface temperature above the Curie point of the coating. A magnetic field applied in the direction opposite to the saturation of the coating and of a value less than the coercive force of the coating causes the heated area to assume reverse magnetisation as it cools to below the Curie point. Alternatively the temperature of the recording location may be raised to a level at which its coercivity falls below the value of the applied field thereby enabling reversal of magnetisation to occur. Read-out is effected by monitoring the rotation of the plane of polarisation of incident light transmitted through or reflected by the material.

OTHER APPLICATIONS

Considerable use can be made of the fact that if electroless plating is continued for sufficient time an electrically conducting product is obtained. Optionally this can then be plated further by conventional electroplating. Thus virtually any article can be rendered conducting provided the appropriate activating component can be introduced onto or into it by coating, soaking, spraying, impregnating or other means of application. The activating component may of course be derived from compounds of the bipyridyl and related types as discussed above. After introduction or formation of the activating component, the article is introduced into the electroless plating bath until the desired amount of metal is deposited, optionally with a sensitisation pretreatment stage.

Metallised foams may be prepared by taking a plastics foam, introducing the active component, electroless plating, consolidating the deposited metal by electroplating and optionally dissolving out, burning off or otherwise removing the plastics material.

In another application a circuit for the construction of electrical or electronic equipment is prepared by forming a circuitwise distribution of activating component over a base support material, e.g. plastics laminate sheet, electroless plating, (after optional sensitisation) and building up the metallic layer to a sufficient thickness by further electroless or conventional electroplating technique. It should be noted that no etching stage is required. Also because of the high resolution of the film, a high component density is possible.

Circuits may also be prepared having regions of differential resistivity by using different metals in different parts thereof. A first circuitwise distribution of active component is plated with a highly conducting metal, e.g. copper. Gaps are left where lower conductivity is required and a second circuitwise distribution of active component is applied to join the gaps. This is then plated to the required degree with a higher resistivity metal e.g. nickel/iron mixtures. This technique is applicable were substrate is used in which the active component is bound in a polymer, e.g. polymers containing bipyridyl radical cations in the backbone or side chain. For example, a film containing a bipyridyl salt is exposed to ultraviolet radiation to form a first circuit image of radical cations and this is electroless plated with a first plating solution, e.g. copper. Gaps are left in the circuit where a resistive component is required. As the bipyridyl salt which is not converted to radical cation is bound in the substrate, it may then be further exposed to ultraviolet radiation to form a second image of radical cations, linked to the first. This is then plated with a second plating solution e.g. an iron-nickel mixture, to form resistive elements. The operation may be repeated with different metals if desired, but the metal of lowest resistivity should be deposited first.

Typical processes according to the invention are illustrated in the following Examples, in which parts are by weight.

EXAMPLE 1

A film of polyvinyl alcohol containing 10% by weight of N,N'-dimethylbipyridilium dichloride was exposed to ultraviolet radiation through a negative of varying optical density. The image obtained was dark blue with an optical density in the range from 0.1 to 1.5. This film was processed by immersion in an electroless plating solution for 20 minutes at 20° C. The developer was prepared from the following components dissolved in water and made up to 1000 parts.

| | |
|---|---|
| Anydrous sodium sulphite | 20 parts |
| Sodium thiosulphate pentahydrate | 30 parts |
| Silver nitrate | 3.0 parts |
| 2,4-Diaminophenol dihydrochloride | 1.5 parts |
| Anhydrous sodium carbonate 1.2 parts | |
| Anhydrous sodium sulphate | 40 parts |
| Sodium tetraborate | 4 parts |

The first four components are based on a physical developer published by A. F. Odell (J. Ind. Eng. Chem. 25, 877 (1933). The last two components were added to reduce the effect of water on the polyvinyl alcohol film.

The blue colour was discharged and was replaced by a dark brownn image with optical density in the range 0.1 to 2.2 after washing and drying.

Similar results were obtained by replacing the sodium sulphate with potassium sulphate (40 parts) or ammonium sulphate (60 parts).

The 2,4-diaminodiphenol dihydrochloride was replaced by the same weight of p-methylaminophenol sulphate ("metol"), p-hydroxy phenylaminoacetic acid ("glycin") or p-aminophenol, and good results were obtained.

Higher contrast and optical density may be achieved by reducing the amount of sodium thiosulphate and increasing the pH by addition of ammonia solution or sodium carbonate. This solution needs to be stabilised against silver deposition by addition of a cationic surface active agent (e.g. "Armeen 12") and to prevent precipitation of thhe cationic agent a non-ionic agent must also be added, (e.g. "Lissapol N"). A suitable amount of detergent is 0.001 to 0.1% by weight.

EXAMPLE 2

This developing solution provides a higher optical density, but is unsuitable for film materials in which there are halides present, because the silver halide is precipitated. The developer was made up by dissolving the following components in water and making up to 1 liter.

| Citric acid | 20 parts |
|---|---|
| Silver nitrate | 1.75 parts |
| p-Methylaminophenol sulphate | 4.0 parts |
| "Lissapol N" } Surface Active Agents | 0.2 part |
| "Armeen 12" | 0.2 part |
| Anhydrous sodium sulphate | 40 parts |

A polyvinyl alcohol film containing 10% by weight of N,N'-dimethylbipyridilium methyl sulphate was exposed to ultraviolet light through a wire mesh grid until the optical density reached about 2. After immersion in the above solution for 10 minutes at 20° C, washing and drying, the silver image had an optical density greater than 4, in the exposed areas.

EXAMPLE 3

The procedure of Example 2 was repeated but including poly(vinyl pyrrolidone) (20 parts) in addition to the surface active agents. With this solution, it was found possible to use active components containing halides without undue fogging.

EXAMPLE 4

A glass plate coated with gelatin was immersed in a 10% aqueous solution of N,N'-dimethylbipyridiliuum dichloride. The plate was dried and exposed to ultraviolet light through a metal grid.

After exposure the plate was immersed in a solution containing

| Copper sulphate pentahydrate | 10 parts |
|---|---|
| Sodium hydroxide | 10 parts |
| Sodium tartrate | 50 parts | made up to 1000 parts, to which 10 parts of 37% formaldehyde solution was added. The blue image became dark brown. After washing and drying density was greater than 2.

EXAMPLE 5

A glass plate coated with gelatine (0.001 inch thick) was immersed in a solution of N,N'-dimethyl bis(-pyridinium) methyl sulphate (10% aqueous solution) for 1 minute, rinsed with distilled water for 5 seconds and allowed to dry. After exposure for about 5 minutes, through a line negative, to a 100 watt mercury vapour lamp at 50 cm. the plate was immersed in a palladium chloride solution made up from $PdCl_2$ (0.1 parts) concentrated hydrochloric acid (10 parts) and water (to 1000 parts). After 1 minute the plate was removed, washed with water and developed in a nickel-based electroless plating solution made up from

| Nickel dichloride ($6H_2O$) | 25 parts |
|---|---|
| Malic acid (monosodium salt) | 65 parts |
| Gluconic acid (sodium salt) | 55 parts |
| Ammonia (solution sg 0.880) | to pH 9 |
| Sodium hypophosphite | 35 parts |

An intense black image was obtained after 1 minute, optical density in fully exposed areas, >3.

The above procedure was repeated using successively as sensitiser, 0.1 part of $PtCl_2$ and $AuCl_3$ with hydrochloric acid (10 parts) and then using $AgNO_3$ (0.1 part) with nitric acid (10 parts). Similar sensitisation was observed.

EXAMPLE 6

The procedure of Example 5 was repeated using the palladium sensitiser, but the period of residence in the nickel solution was increased to 30 minutes. The image became metallic in appearance and was sufficiently conductive to be electroplated.

EXAMPLE 7

A polyethylene terephthalate film ("Melinex") sub-coated with an alkyd resin varnish was coated with a solution containing

| poly(N,N'-p-xylylene-4,4'-bipyridilium dichloride) | 0.5 part |
|---|---|
| poly(vinyl alcohol), high molecular weight, high hydrolysis grade | 10 parts |
| Glyoxal Hydrate | 1.0 part |
| Ammonium chloride | 0.2 part |
| water to | 150 parts |

The solution was evaporated to give a sensitive coating about 0.025 mm thick. Preparation was carried out under subdued artificial light. The film was exposed through a line negative for 3 minutes under the conditions of Example 5. After exposure it was immersed in a solution of auric chloride (0.5 part) and concentrated hydrochloric acid (10 parts) in water (to 1000 parts) for 1 minute.

After washing, development was completed by immersion in a commercially available electroless nickel plating solution (Emplate Ni-410, Enthone Inc.) at room temperature for 5 minutes. A black image was obtained with an optical density in the fully exposed area, >2.

EXAMPLE 8

Two pieces of coated film prepared as in Example 7 were exposed and sensitised with a palladium salt as in Example 5. They were then washed and developed in the following solution.

| Cobalt trichloride ($6H_2O$) | 27 parts |
|---|---|
| Sodium citrate ($2H_2O$) | 90 parts |
| Ammonium chloride | 45 parts |
| Sodium hypophosphite | 7.5 parts |
| Water to | 1000 parts |
| pH adjusted with ammonia solution to 8.5 | |

A brown image was obtained.

One piece was subjected to prolonged development (45 minutes) and the other to a higher solution temperature (~80° C, 3 minutes). In both cases conducting cobalt films were obtained.

EXAMPLE 9

A glass plate was coated, exposed and sensitised by the procedure of Example 5. After washing, the gelatine layer was hardened by formaldehyde treatment (5 minutes) in a solution consisting of

| | |
|---|---|
| Formaldehyde solution (40%) | 10 parts |
| Sodium carbonate (anhydrous) | 5 parts |
| Water to | 1000 parts |

It was then developed in the following solution for 3 minutes at 80° C.

| | |
|---|---|
| Cobalt chloride (6H$_2$O) | 60 parts |
| Nickel chloride (6H$_2$O) | 2 parts |
| Sodium potassium tartrate (4H$_2$O) | 200 parts |
| Ammonium chloride | 50 parts |
| Sodium hypophosphite | 17 parts |
| Water to | 1000 parts |
| Ammonia | to pH 9 |

A dense black image was obtained.

EXAMPLE 10

A plate was coated, exposed and sensitised as in Example 5 and then developed for 10 minutes at room temperature in the following solution.

| | |
|---|---|
| Ferrous sulphate (7H$_2$O) | 120 parts |
| Sodium citrate (2H$_2$O) | 170 parts |
| EDTA | 50 parts |
| Sodium hypophosphite | 85 parts |
| 38% formaldehyde solution | 200 parts |
| Water | 800 parts |
| Ammonium hydroxide solution | to pH 10 |

A dense black image was obtained.

EXAMPLE 11

A solution of diphenyl picryl hydrazyl (2% in acetone) was used to draw an image on a piece of polyvinyl alcohol film, which was then dried under nitrogen. The film was sensitised with 0.1% palladium chloride solution and then developed in the copper plating solution of Example 4. After 5 minutes the image had a dark brown-black appearance. After 30 minutes the image was metallic and had a resistance of about 200 ohm/square.

EXAMPLE 12

An open cell polyurethane foam was impregnated with a solution containing

| | |
|---|---|
| Poly(vinyl alcohol) | 20 parts |
| N,N'-dimethylbipyridilium methyl sulphate | 1 part |
| Water to | 1000 parts |

The foam was drained, dried and the radical was formed by heating at 100° C for 30 minutes. The foam was then immersed in a plating solution as described in Example 4 and a red-brown deposit of copper formed throughout the foam, which was then found to be conductive.

EXAMPLE 13

The surface of a piece of phenol formaldehyde laminate was roughened (by abrading it with emery paper), coated with the following solution and allowed to dry.

| | | |
|---|---|---|
| (cross-linking agent) | PV Alcohol (Du Pont Elvanol 100-30) | 10 parts |
| | Glyoxal Hydrate | 1 part |
| (cross-linking catalyst) | Paraquat dichloride | 0.5 part |
| | Ammonium chloride | 0.2 part |
| | Water | 100 parts |

After exposure to UV light through a printed circuit negative, the board was developed in the following solution for 30 minutes at room temperature (20° C).

| | |
|---|---|
| Copper sulphate pentahydrate CuSO$_4$ . 5H$_2$O | 10 parts |
| Sodium potassium tartrate | 50 parts |
| Sodium Hydroxide | 10 parts |
| 37% Formaldehyde solution | 10 parts |
| Water 1000 parts | |

The resulting deposit of copper had a resistivity of <1 ohm/square and cold be built up in thickness by electroplating or continued immersion in the above solution. These thicker deposits of copper (0.001 - 0.002 inch) could be soldered using conventional techniques.

EXAMPLE 14

A polyethylene terephthalate film ("Melinex") subcoated with an alkyd resin varnish was coated with a solution containing

| | |
|---|---|
| N,N'-p-cyanophenyl-4,4'-bipyridiliumdimethosulphate | 1.0 part |
| Poly(vinnyl alcohol), high molecular weigh, high hydrolysis grade | 10 parts |
| Glyoxal | 0.5 part |
| H$_2$SO$_4$ | to pH 3-4 |
| Water to | 100 parts. |

The solution was evaporated at a temperature not exceeding 75° C to give a sensitive coating about 0.003 mm thick.

Preparation was carried out under subdued artificial light. The film was exposed to electrons from a scanning electron microscope. The electron energy was varied from 10 - 80 keV. Estimated spot size was 0.2 - 0.5 μ. The image colour was dark green. After developing in the plating solution of Example 1 for 5 minutes the exposed film showed regular line patterns. 2000 line pairs per mm were well resolved.

On extended exposure to electrons the image became red due to the formation of the neutral compound, which could also be plated with the solution of Example 1.

EXAMPLE 15

A coated polyethylene terephthalate film was prepared as in Example 14 and exposed to ultraviolet radiation in the cavity of an electron spin resonance spectrometer. A green colouration of the radical cation formed and the spin concentration increased linearly with exposure time up to 2.5 × 10$^{15}$ spins/cm$^2$. The optical density reached 0.5 at 610 nm. The radical cation image was immersed in the plating solution of Example 1 and a very dark brown image of optical density >4 attained.

EXAMPLE 16

A coated polyethylene terephthalate film was prepared as in Example 14 and exposed to electrons in an scanning electron microscope at an energy of 50 kev. The exposed film had an optical density of 0.5 at 610 nm and the radical concentration was $1.4 \times 10^{16}$ spins/cm$^2$, as measured by electron spin resonance. After immersion in the plating solution of Example 1 the image was examined by electron microscopy and was shown to have resolved >1500 line pairs/mm.

EXAMPLE 17

A coated polyethylene terephthalate film was prepared as in Example 14 and exposed to ultraviolet radiation through a metal grid to produce a dark green radical cation image. An electroless plating solution was prepared by the method of Belgian Patent 637398.

| Solution A | |
|---|---|
| Ferrous ammonium sulphate | 78 parts |
| Ferric nitrate | 8 parts |
| Citric acid | 10.5 parts |
| "Lissapol N" | 0.2 part |
| Dodecylamine | 0.2 part |
| Water | to 1000 parts |
| Solution B | |
| Silver nitrate | 8.5 parts |
| Water | to 100 parts |

Before use 1 part of B was mixed with 9 parts of A. After 5 minutes immersion in this solution a black image was obtained.

EXAMPLE 18

An aqueous solution containing 3 parts of a polymer consisting of units of the structure

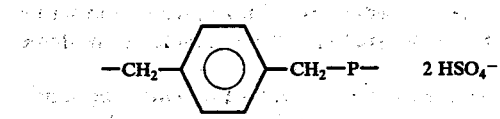

and 15 parts of poly(vinyl alcohol) was prepared.

A film formed by coating on a glass plate produced a blue or purple radical cation image on exposure to UV light. The image was developed with the plating solution of Example 1 to give a black image.

EXAMPLE 19

A polymer was prepared from p-xylene dichloride and 2,2'-bipyridyl. The polymer analysed consistent with the repeating units:

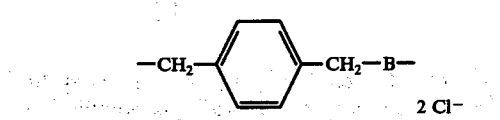

A poly(vinyl alcohol) film containing this polymer rapidly turned blue on exposure to sunlight, and on immersion in the plating solution of Example 1 a black deposit was obtained.

EXAMPLE 20

A film was cast from a solution containing 10% poly(vinyl alcohol), 1% N,N'-bisphenyl-2,7-diazapyrinium difluoroborate, 0.2% ammonium chloride, 0.5% glucose. The film responded to light of wavelength up to at least 436 nm, to give a radical cation image which blackened when immersed in the plating solution of Example 3.

EXAMPLE 21

A film was cast following the procedure of Example 20 using 1,2-bis(1'-methyl-4'-pyridinium)ethylene di(-methyl sulphate). It gave a magenta image in sunlight, when exposed through a metal grid. The magenta image blackened when immersed in the plating solution of Example 3.

EXAMPLE 22

A magnetic tape having a multifilamentary recording pattern was made in this Example.

The support was a balanced biaxially oriented and heat set polyethylene terephthalate film coated with an anchor coating of thickness 1 micron comprising a copolymer of 88% vinylidene chloride and 12% acrylonitrile.

The film had an overall thickness of 36 microns.

A coating composition incorporating N,N'-dimethyl bipyridilium as the active component and polyvinyl alcohol as a carrier matrix was made up in water. The composition had the following constitution 10% du Pont grade 72-60 "Elvanol" 99-100% hydrolysed polyvinyl alcohol.

1% N,N'-dimethylbipyridilium dimethyl sulphate.

This composition was applied to the subbed surface of the support film and dried slowly at room temperature (15°-30° C).

The dried film was exposed to ultra-violet light for 60 seconds through a lined negative image so as to sensitize the coating by exposure in tracks 0.04 mm wide spaced 0.01 mm.

An activator solution was made up having the following constitution:

0.1 part palladium chloride
10 parts concentrated hydrochloric acid
40 parts anhydrous sodium sulphate
4 parts borax
1000 parts distilled water.

The exposed film was immersed in a bath of the sensitiser solution maintained at a temperature of 25° C for one minute to deposit a layer of palladium metal over the exposed parts of the coating. The film was then washed with distilled water.

An electroless plating solution of the following composition was used to deposit a layer of metal upon the surface of the support:

25 parts Nickel dichloride (6H$_2$O)
65 parts Malic acid (monosodium salt)
55 parts Gluconic acid (sodium salt)
35 parts Sodium hypophosphite
40 parts Anhydrous sodium sulphate
4 parts Borax
Ammonia solution, S.G. 0.880 to pH9.

The bath was maintained at a temperature of 30° C and plating was effected for about 60 minutes. The plated film was finally washed with distilled water and was found to have a strongly adherent nickel/phosphorus coating about one micron in thickness in the regions exposed to the ultra-violet light which was capable of information storage by employing inductive recording techniques for write-in and read-out.

EXAMPLE 23

A multifilamentary recording pattern was applied to a carrier by this Example.

The support was a balanced biaxially oriented and heat set polyethylene terephthalate film coated with an anchor coating of thickness 1 micron comprising a copolymer of 88% vinylidene chloride and 12% acrylonitrile, and a layer of gelatin; 0.001 inch thick. The gelatin surface was immersed in a solution of N,N'-dimethyl bis(pyridinium)methyl sulphate (10% aqueous solution) for 1 minute, rinsed with distilled water for 5 seconds and allowed to dry.

The coated film was exposed for about 5 minutes through a line negative to a 100 watt mercury vapour lamp at 50 cm, followed by a treatment for five minutes to harden the gelatin layer in the following solution:

10 parts Formaldehyde solution (40%)
5 parts Anhydrous sodium carbonate
Water to make 1000 parts.

The film was immersed for 1 minute in an activator solution of the following composition:

0.1 part Palladium chloride
10 parts Concentrated hydrochloric acid
40 parts Anhydrous sodium sulphate
4 parts Borax
1000 parts Distilled water.

The film was then washed in distilled water and developed in a nickel-based electroless plating solution made up from 60 parts Cobalt chloride (6H$_2$O)
2 parts Nickel dichloride (6H$_2$O)
200 parts Sodium Potassium tartrate (4H$_2$O)
50 parts Ammonium chloride
17 parts Sodium hypophosphite
40 parts Anhydrous sodium sulphate
4 parts Borax
Ammonia solution, S.G. 0.880 to pH9
Water to 1000 parts.

The developing bath was maintained at a temperature of 30° C and plating was effected for about 60 minutes. The plated film was washed with distilled water. A strongly adherent black coating was deposited in the regions exposed to ultra-violet light. The coating was capable of information storage which could be written-in and read-out by inductive recording techniques.

EXAMPLE 24

Example 22 was repeated so as to deposit an array of elliptical spots of magnetic material on the film. The film was exposed to ultra-violet light through a negative of the desired elliptical spots.

The spots of nickel/phosphorus applied to the film were found to be strongly adherent thereto.

Information was stored on the carrier so obtained by a magneto-optic technique in which magnetic coating, which was in a state of uniform saturation in one direction prior to recording, was illuminated by a laser beam (argon ion, 1 watt output) representing the information to be recorded. A magnetic field of 150 oersteds was applied in the direction opposite to the initial direction of saturation.

The stored information was read-out by observing a rotation in the plane of polarisation of incident light reflected from the elliptical recording spots on the surface of the film.

I claim:

1. A process for the deposition of metal in or on substrate characterized in that the substrate contains or consists of, as active component, a polymeric compound comprising units derived from a cation of the general formula

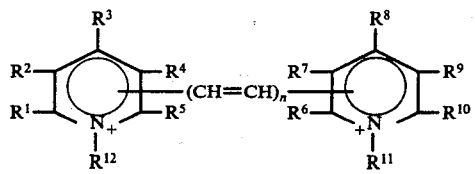

where $R^{1\text{-}12}$ are hydrogen, halogen or organic substituents and $n = 0$ or an integer, comprising contacting the substrate with an electroless plating solution.

2. A process according to claim 1 in which the substrate is contacted first with a sensitiser comprising a solution of a compound of a metal of the platinum group, silver or gold and subsequently with the electroless plating solution.

3. A process according to claim 2 wherein said polymeric compound consists of units having the structure

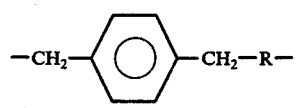

where R is a bipyridilium group selected from the group consisting of 4,4'-bipyridylium; 4,4'-biquinolinium; 1,2-bis(4-pyridyl) ethylene; 2,7-diazapyrinium; 2,2'-bipyridyl and 4-(4'-pyridyl) pyridinium.

4. A process according to claim 1 in which the active component is supported in a water soluble or swellable polymer.

5. A process according to claim 1 in which the active component is formed in situ from the cation by radiation or by heat.

6. A data recording process which comprises preparing a substrate, containing or consisting of, as active component, a polymeric compound comprising units derived from a cation of the general formula

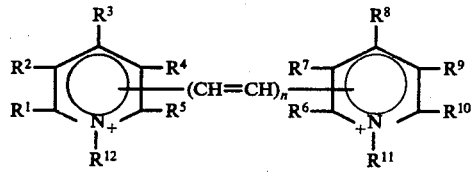

where $R^{1\text{-}12}$ are hydrogen, halogen or organic substituents and $n = 0$ or an integer, comprising contacting the substrate with an electroless plating solution, exposing said substrate to radiation or heat, and subsequently contacting with an electroless plating solution.

7. A data recording process according to claim 6 in which the exposed material is contacted with a sensitising solution of a metal of the platinum group, silver or gold before contact with the electroless plating solution.

8. A data recording process according to claim 6 in which the plating solution is a ferromagnetic material plating solution.

9. A data recording process according to claim 8 in which the plating solution is selected from cobalt/phosphorus, nickel/phosphorus and cobalt/nickel/phosphorus plating solutions.

10. A data recording process according to claim 8 wherein the imagewise distribution of polymeric compound is a series of discrete tracks on the support.

11. A data recording process according to claim 6 in which the support is a non-magnetic disc bearing a coating containing said salt.

12. A data recording process according to claim 6 in which the support is a polymeric film bearing a coating containing said salt.

13. A data recording process according to claim 12 in which the support is a tape formed from a linear polyester.

14. A data recording process according to claim 6 wherein said polymeric compound consists of units having the structure

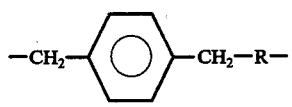

where R is a bipyridilium group selected from the group consisting of 4,4'-bipyridylium; 4,4'-biquinolinium; 1,2-bis(4-pyridyl) ethylene; 2,7-diazapyrinium; 2,2'-bipyridyl and 4-(4'-pyridyl) pyridinium.

15. A method of producing metallised foam which includes the steps of introducing an active polymeric compound comprising units derived from a cation of the general formula

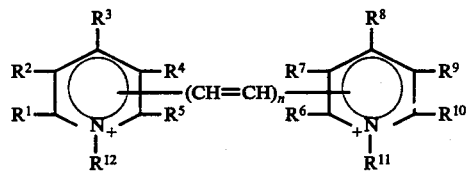

wherein $R^{1-12}$ ae hydrogen, halogen, or organic substituents and $n = 0$ or an integer into a plastics foam and electroless plating, consolidating the deposited metal by electroplating and optionally removing the plastics material.

16. A method of producing metallised foam according to claim 15 wherein said polymeric compound consists of units having the structure

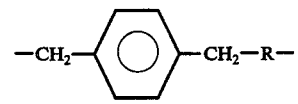

where R is a bipyridilium group selected from the group consisting of 4,4'-bipyridylium; 4,4'-biquinolinium; 1,2-bis(4-pyridyl) ethylene; 2,7-diazapyrinium; 2,2'-bipyridyl and 4-(4'-pyridyl) pyridinium.

17. A method of producing printed circuits for electrical or electronic devices in which a circuitwise distribution of a polymer compound comprising of units of an active component derived from a cation of the general formula

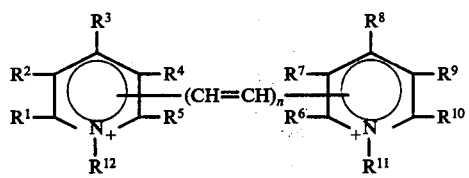

where $R^{1-12}$ are hydrogen, halogen or organic substituents and $n=0$ or an integer is formed on a base support material, electroless plating, and building up the metallic layer by further plating.

18. A method of producing printed circuits according to claim 17 wherein said polymeric compound consists of units having the structure

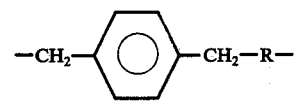

where R is a bipyridilium group selected from the group consisting of 4,4'-bipyridylium; 4,4'-biquinolinium; 1,2-bis(4-pyridyl) ethylene; 2,7-diazapyrinium; 2,2'-bipyridyl and 4-(4'-pyridyl) pyridinium.

19. A method according to claim 17 for the production of circuits having regions of differing resistivity in which a first circuitwise distribution of active components is plated with a first metal and then a second circuitwise distribution of active component is plated with a second metal of higher resistivity than the first.

* * * * *